United States Patent
Du et al.

(10) Patent No.: US 11,630,768 B2
(45) Date of Patent: Apr. 18, 2023

(54) METHOD FOR MANAGING FLASH MEMORY MODULE AND ASSOCIATED FLASH MEMORY CONTROLLER AND ELECTRONIC DEVICE

(71) Applicant: Silicon Motion, Inc., Hsinchu County (TW)

(72) Inventors: Jian-Dong Du, Taoyuan (TW); Chia-Jung Hsiao, New Taipei (TW); Pi-Ju Tsai, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 17/853,888

(22) Filed: Jun. 29, 2022

(65) Prior Publication Data
US 2022/0334960 A1   Oct. 20, 2022

Related U.S. Application Data

(63) Continuation of application No. 16/683,211, filed on Nov. 13, 2019, now Pat. No. 11,409,650.

(30) Foreign Application Priority Data

Jan. 24, 2019  (TW) .................... 108102679

(51) Int. Cl.
*G06F 12/00* (2006.01)
*G06F 12/02* (2006.01)
(Continued)

(52) U.S. Cl.
CPC ........ *G06F 12/0246* (2013.01); *G06F 11/076* (2013.01); *G06F 12/0882* (2013.01);
(Continued)

(58) Field of Classification Search
CPC ............ G06F 12/0246; G06F 12/0882; G06F 13/1689; G06F 11/076; G06F 2212/7201;
(Continued)

(56) References Cited

U.S. PATENT DOCUMENTS

| 8,145,828 B2 | 3/2012 | Ouchi |
| 9,122,592 B2 | 9/2015 | Cheon |

(Continued)

FOREIGN PATENT DOCUMENTS

| CN | 106484316 A | 3/2017 |
| CN | 106598484 A | 4/2017 |

(Continued)

OTHER PUBLICATIONS

Authors: Tang Xian, Meng Xiao-Feng, Name: FClock: An Adaptive Buffer Replacement Algorithm for SSD, Source: Chinese Journal of Computers, vol. 33, No. 8, Publisher: China Academic Journal Electronic Publishing House Publication, Date: Aug. 2010, China, pp. 1460-1471.

*Primary Examiner* — John A Lane
(74) *Attorney, Agent, or Firm* — Winston Hsu

(57) ABSTRACT

A flash memory controller includes a read only memory (ROM) and a microprocessor. The ROM is arranged to store a program code. The microprocessor is arranged to execute the program code to control access of a flash memory module. When executing the program code, the microprocessor is arranged to perform operations of: monitoring data retention state of one or more blocks in the flash memory module by reading a last page of the one or more blocks to obtain time information regarding the one or more blocks, (Continued)

which is generated by the flash memory controller; and arranging a specific block to a garbage collection process if time information obtained from the last page of the specific block exceeds a threshold.

15 Claims, 8 Drawing Sheets

(51) Int. Cl.
G06F 12/0882 (2016.01)
G06F 13/16 (2006.01)
G11C 7/22 (2006.01)
G11C 11/4074 (2006.01)
G06F 11/07 (2006.01)

(52) U.S. Cl.
CPC .......... *G06F 13/1689* (2013.01); *G11C 7/222* (2013.01); *G11C 11/4074* (2013.01); *G06F 2212/7201* (2013.01); *G06F 2212/7209* (2013.01)

(58) Field of Classification Search
CPC ............ G06F 2212/7209; G11C 7/222; G11C 11/4074
See application file for complete search history.

(56) References Cited

U.S. PATENT DOCUMENTS

| | | | |
|---|---|---|---|
| 11,210,209 B2* | 12/2021 | Du | G06F 3/064 |
| 2013/0067142 A1 | 3/2013 | Choi | |
| 2015/0085577 A1* | 3/2015 | Suzuki | G06F 12/0246 365/185.11 |
| 2016/0179386 A1* | 6/2016 | Zhang | G06F 3/0679 711/103 |
| 2017/0285961 A1 | 10/2017 | Li | |
| 2017/0286012 A1 | 10/2017 | Chou | |
| 2017/0329525 A1 | 11/2017 | Simonson | |
| 2019/0294341 A1* | 9/2019 | Sun | G06F 3/0679 |
| 2019/0354314 A1 | 11/2019 | Hung | |
| 2020/0183474 A1* | 6/2020 | Kim | G06F 3/0617 |
| 2020/0335169 A1* | 10/2020 | Yu | G11C 16/3436 |
| 2021/0240385 A1 | 8/2021 | Tai | |
| 2021/0405724 A1* | 12/2021 | Kim | G06F 1/305 |
| 2022/0004339 A1 | 1/2022 | Lin | |

FOREIGN PATENT DOCUMENTS

| | | | |
|---|---|---|---|
| TW | I576699 B | 4/2017 | |
| TW | I579696 B | 4/2017 | |

* cited by examiner

METHOD FOR MANAGING FLASH MEMORY MODULE AND ASSOCIATED FLASH MEMORY CONTROLLER AND ELECTRONIC DEVICE

CROSS REFERENCE TO RELATED APPLICATIONS

This application is a continuation application of U.S. application Ser. No. 16/683,211, filed on Nov. 13, 2019. The content of the application is incorporated herein by reference.

BACKGROUND OF THE INVENTION

1. Field of the Invention

The present invention related to applications of a flash memory controller.

2. Description of the Prior Art

With the developments of flash memory techniques, the arrangement of memory units in a flash memory chip has changed from parallel arrangements to stacked multi-layer fashions, which allows a chip to comprise more memory units and therefore increases the overall capacity the chip. However, the aforementioned 3D flash memory design suffers from data retention issues, i.e., the data quality thereof could drops drastically right after the chip is written with data, making the data not be read correctly. Hence, there is a need for a novel management method to solve the above data retention issue.

SUMMARY OF THE INVENTION

The present invention provides a method of managing flash memories, which may effectively and quickly find the blocks that going to encounter data retention problems and properly process them in order to solve the issues existing in related art techniques.

An embodiment of the present invention discloses a flash memory controller. The flash memory controller is arranged to access a flash memory module, the flash memory module comprises multiple flash memory chips each comprising multiple blocks, each of the blocks comprises multiple pages, and the flash memory controller comprises a read only memory (ROM), a microprocessor and a time-management circuit. The ROM is arranged to store a program code. The microprocessor is arranged to execute the program code to control the access of the flash memory module. When executing the program code, the microprocessor is arranged to perform operations of: monitoring data retention state of one or more blocks by reading a last page of the one or more blocks to obtain time information regarding the one or more blocks, wherein the time information regarding the one or more blocks is generated by the flash memory controller; and arranging a specific block to a garbage collection process if time information obtained from the last page of the specific block exceeds a threshold.

Another embodiment of the present invention discloses a method of managing a flash memory module, wherein the flash memory module comprises multiple flash memory chips each comprising multiple blocks, each of the blocks comprises multiple pages, and the method comprises: monitoring data retention state of one or more blocks by reading a last page of the one or more blocks to obtain time information regarding the one or more blocks, wherein the time information regarding the one or more blocks is generated by the flash memory controller; and arranging a specific block to a garbage collection process if time information obtained from the last page of the specific block exceeds a threshold.

Yet another embodiment of the present invention discloses an electronic device which comprises a flash memory module and a flash memory controller. The flash memory module comprises multiple flash memory chips each comprising multiple blocks, and each of the blocks comprises multiple pages. The flash memory controller is arranged to access the flash memory module. The flash memory controller monitors data retention state of one or more blocks by reading a last page of the one or more blocks to obtain time information regarding the one or more blocks, wherein the time information regarding the one or more blocks is generated by the flash memory controller; and the flash memory controller arranges a specific block to a garbage collection process if time information obtained from the last page of the specific block exceeds a threshold.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
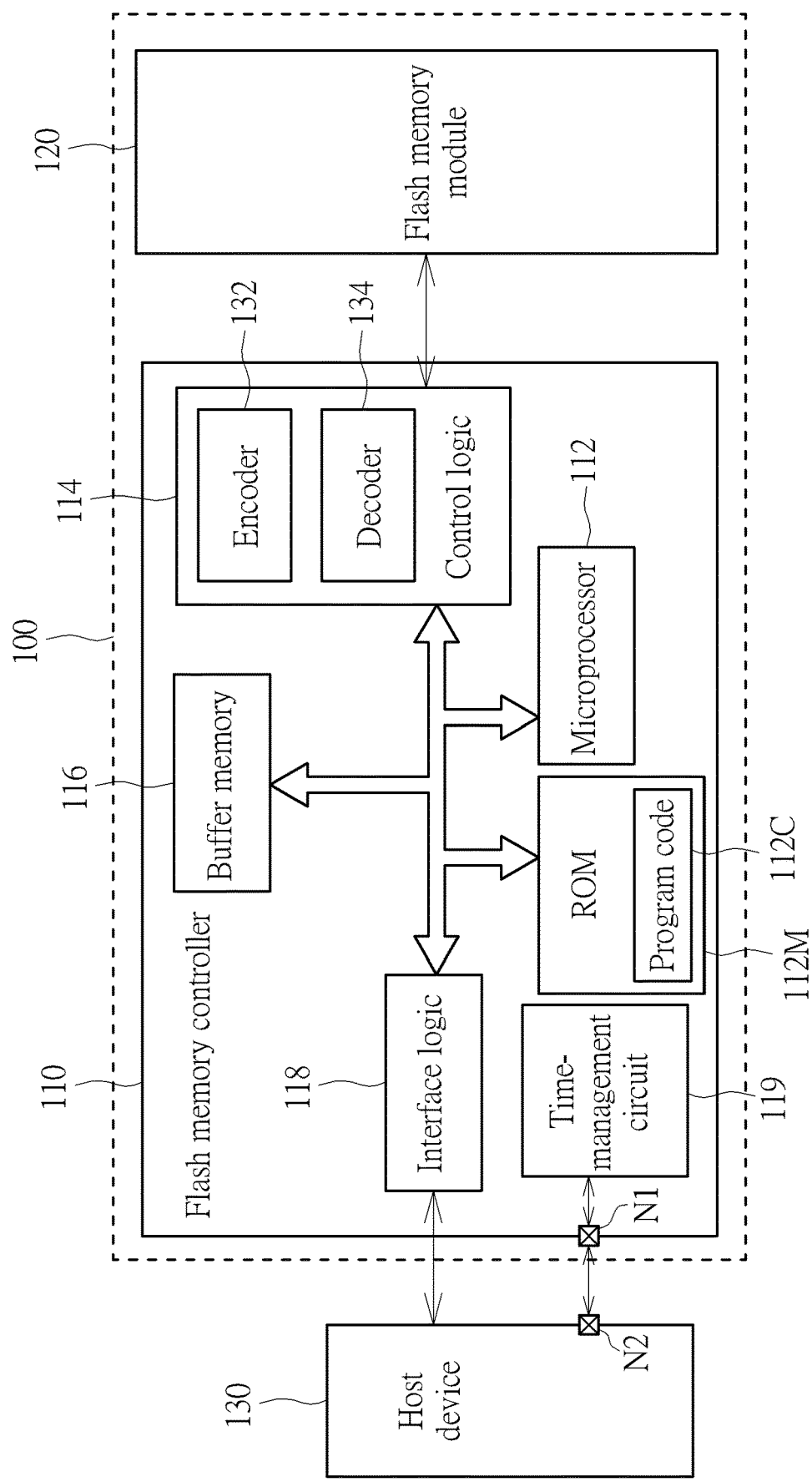
FIG. 1 is a diagram illustrating a memory device according to a first embodiment of the present invention.

FIG. 1 is a diagram illustrating a memory device 100 according to a first embodiment of the present invention. The memory device 100 comprises a flash memory module 120 and a flash memory controller 110, and the flash memory controller 110 is arranged to access the flash memory module 120. In this embodiment, the flash memory controller 110 comprises a microprocessor 112, a read only memory (ROM) 112M, a control logic 114, a buffer memory 116, an interface logic 118 and a time-management circuit 119. The ROM 112M is arranged to store a program code 112C, and the microprocessor 112 is arranged to execute the program code 112C to control the access of the flash memory module 120. The control logic 114 comprises an encoder 132 and a decoder 134, wherein the encoder 132 is arranged to encode the data written into the flash memory module 120 in order to generate a corresponding checking code (which can be also called as error correction code, ECC), and the decoder 134 is arranged to decode the data read from the flash memory module 120.

Typically, the flash memory module 120 comprises multiple flash memory chips, and each flash memory chip comprises a plurality of blocks. The flash memory controller 110 uses "block" as the unit to erase data from the flash memory module 120. A block may record a specific number of pages, and the flash memory controller 110 uses "page" as the unit to write data into the flash memory module 120. In this embodiment, the flash memory module 120 may be a 3D NAND-type flash memory module.

In practice, the flash memory controller 110 may utilize the internal elements thereof to execute the program code 112C via the microprocessor 112 to perform various control operations, such as utilizing the control logic 114 to control the access of the flash memory module 120 (more particularly the access of at least one block or at least one page), utilizing the buffer memory 116 to perform the required buffering process, and utilizing the interface logic 118 to communicate with a host device 130. Further, the time-management circuit 119 may be connected to a specific pin N2 of the host device via a specific pin N1 of the flash memory controller. The buffer memory 116 may be implemented with a random access memory (RAM). For example, the buffer memory 116 may be a static random access memory (SRAM), but the present invention is not limited thereto.

In an embodiment, the memory device 100 may be a portable memory device (e.g. a memory card conforming to the SD/MMC, CF, MS and/or XD specification), and the host device 130 is an electronic device connectable to a memory device, such as smartphone, laptop computer, desktop computer, etc. In another embodiment, the memory device 100 may be a solid state drive (SSD) or an embedded storage device conforming to the Universal flash storage (UFS) or Embedded Multi Media Card (EMMC) specification, which can be installed in an electronic device, such as a smartphone, laptop computer or desktop computer, wherein the host device 130 may be a processor of the electronic device.

Figure 2:
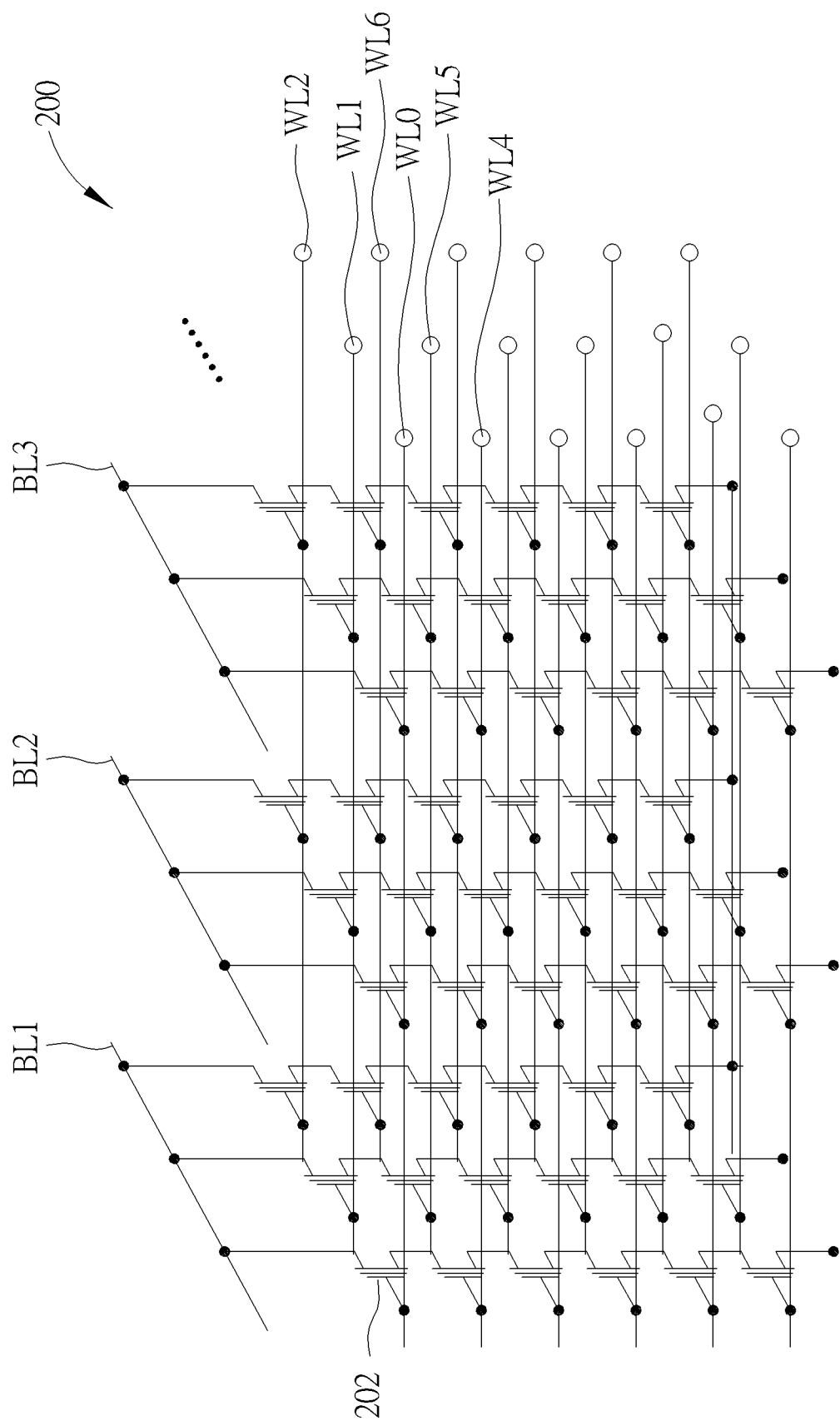
FIG. 2 is a diagram illustrating a block in a flash memory module according to an embodiment of the present invention.

FIG. 2 is a diagram illustrating a block 200 in the flash memory module 120 according to an embodiment of the present invention, wherein the flash memory module 120 is a 3D NAND-type flash memory. As shown in FIG. 2, the block 200 comprises multiple memory units (e.g. the floating-gate transistor 202 or those charge trapping elements shown in the figure), and constructs a 3D NAND-type flash memory structure via multiple bit lines (e.g. the bit lines BL1-BL3 shown in the figure) and multiple word lines (e.g. the word lines WL0-WL2, WL4-WL6 shown in the figure). Please refer to FIG. 2, taking the uppermost plane as an example, all floating-gate transistors on the word line WL0 construct at least one page, all floating-gate transistors on the word line WL1 construct at least another page, and all floating-gate transistors on the word line WL2 construct at least yet another page, and so on. Further, based on different writing methods of the flash memory, the definition between the word line WL0 and the page can be different. Specifically, when writing in the single-level cell (SLC) manner, all floating-gate transistors on the word line WL0 are only corresponding to one single logic page; when writing in the multi-level cell (MLC) manner, all floating-gate transistors on the word line WL0 are corresponding to two logic pages; when writing in triple-level cell (TLC) manner, all floating-gate transistors on the word line WL0 are corresponding to three logic pages; and when writing using quad-level cell (QLC) manner, all floating-gate transistors on the word line WL0 are corresponding to four logic pages. Since one skilled in the art should be readily to understand the structure and of a 3D NAND-type flash memory and the relationship between word lines and pages, the detailed descriptions thereof are omitted here for brevity.

The structure depicted in FIG. 2 is merely a basic structure of a 3D flash memory, but there could be more stacked layers in actual manufacturing to achieve a denser storing capacity, however. Since the 3D flash memory adopts the stacked structure shown in FIG. 2, the data storing will suffer from severe data retention issues, i.e., after the data is written into the block 200, the memory units therein might suffer from data quality issues (such as data writing level shifts, threshold voltage shifts, etc.) after a period of time, causing difficulties in decoding the data in the block 200 in the follow-up reading, or even causing data lost due to unsuccessful decoding. To solve the above problems, this embodiment proposes a managing method applicable to the flash memory module 120, which may set a time-management circuit 119 in the flash memory controller 110 to effectively record time information of each block, in order to perform quality examination for follow-up processes. The specific operations are described as follows.

Figure 3:
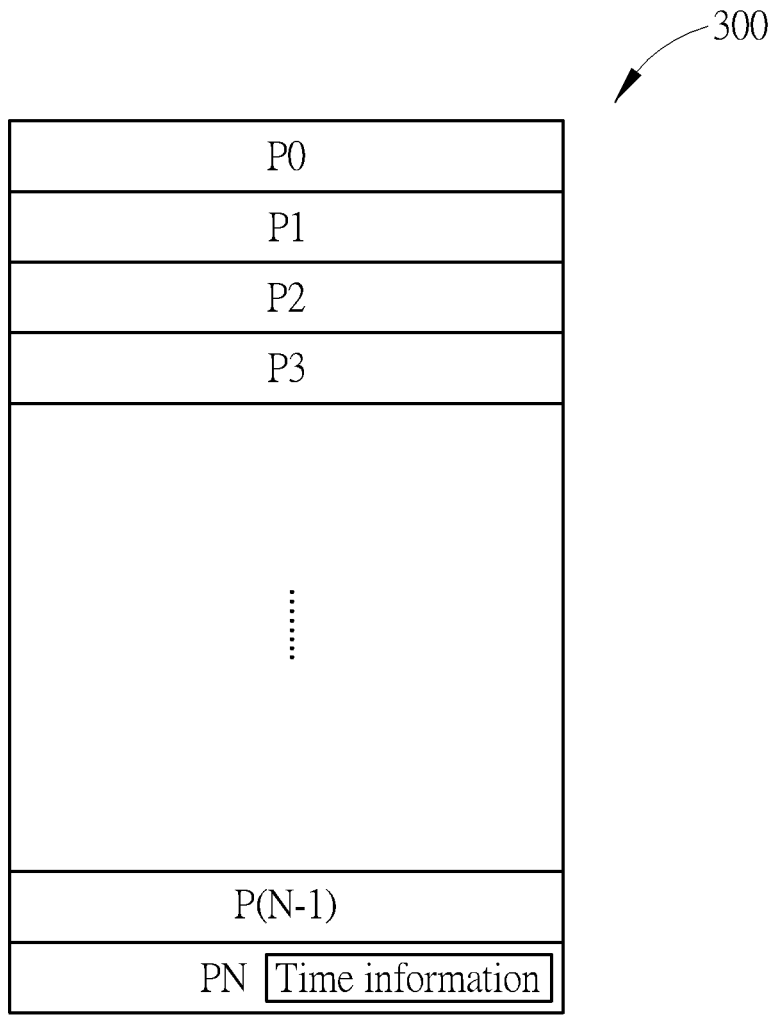
FIG. 3 is a diagram illustrating a block and pages thereof.

FIG. 3 is a diagram illustrating the block 200 and pages P0-PN thereof. When the flash memory controller 110 needs to write the data from the host device 130, the data in other blocks of the flash memory module 120 and/or the data temporarily stored in the flash memory controller 110 itself to the block 200, the flash memory controller 110 will sequentially write these data into the pages, starting from the first page P0 to the last page PN. In this embodiment, when the flash memory controller 110 is ready to write data into the very last page PN or last few pages, the time-management circuit 119 will send a request command to the host device 130 via the specific pin N1 in order to request the host device 130 to provide current time information. Since the host device 130 itself is connected to the operating system, the current time information (e.g. the month, date, minute, second, etc.) may be provided to the time-management circuit 119. After the time-management circuit 119 calculates the time information, it will provide the time information to the microprocessor 112 to be processed by the encoder 132 and written along with other data into the page PN.

Since the time recorded by the last page PN of the block 200 is an absolute time (e.g., a time stamp), when the flash memory controller 110 and the flash memory module 120 are later in the idle state, the flash memory controller 110 may scan each block, and directly reads the last page PN of each block in order to obtain the time the block finishes the writing operation. After that, the flash memory controller 110 may obtain the current time obtained by the host device 130 via the time-management circuit 119 in order to determine the length of time of data in each block (i.e. the elapse time from each block finishing writing to performing block scan). In this embodiment, if the time the data is stored in a block is longer than a threshold (e.g., a month or few weeks has passed after the block finishes writing), the flash memory controller 110 may determine the block as encountering data retention problems, and may arrange the block to a garbage collection process which will move valid data in the block to another block and then erase the remaining contents in the block.

As can be seen from the above, with the management method in this embodiment, the flash memory controller 110 may be easily and effectively aware of know how long the data has been stored in each block, for determining whether each block is going to encounter data retention problems and thereby properly dealing with the situation.

Figure 4:
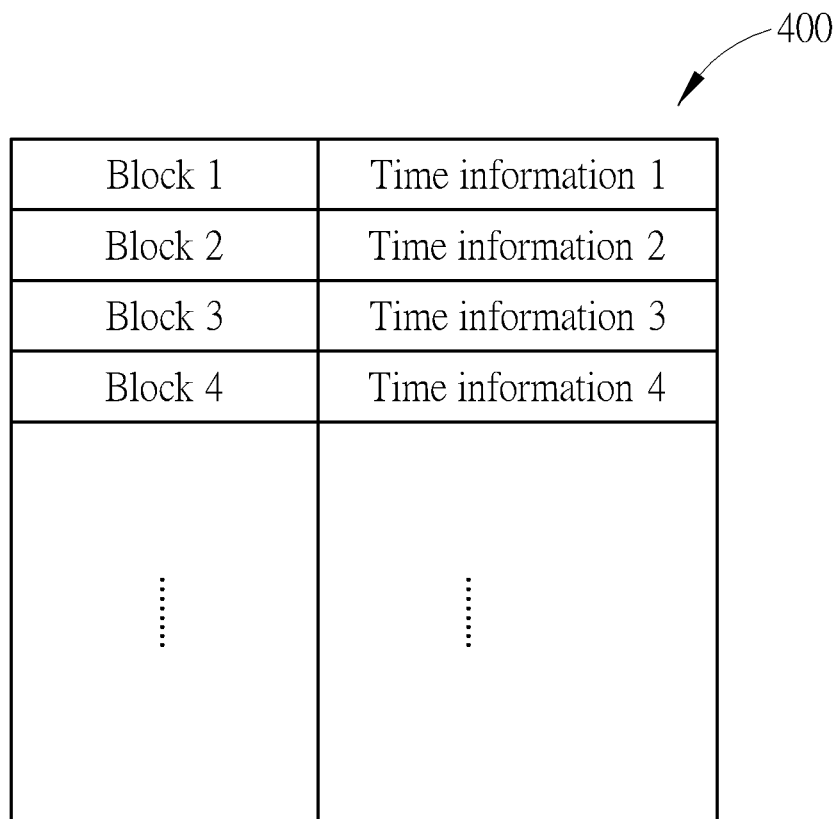
FIG. 4 is a diagram illustrating time information comparison table according to an embodiment of the present invention.

In another embodiment of the present invention, in addition to writing time information into the last page PN of each block, the microprocessor 112 further may create time information comparison table 400 as shown in FIG. 4, which records time information (e.g., Time information 1, Time information 2, Time information 3 and Time information 4 shown in FIG. 4) written into each block (e.g., Block 1, Block 2, Block 3 and Block 4 shown in FIG. 4). In this embodiment, the time information comparison table 400 may temporarily be stored in an external dynamic random access memory (DRAM) or an internal buffer memory 116 of the flash memory controller 110, so that the flash memory controller 110 may more quickly determine how long the data has been stored in each block without the need for reading each block of the flash memory module 120, and thereby properly performs the follow-up processing.

Further, when the flash memory controller 110 is ready to be powered off or the memory thereof is required to release some space, the time information comparison table 400 may be written to a suitable address in the flash memory module 120 to prevent data loss.

In another embodiment, in order to more effectively use the memory space, the contents in the time information comparison table 400 may be integrated into another mapping table, e.g. the logical address to physical address mapping table or the physical address to logical address mapping table.

Figure 5:
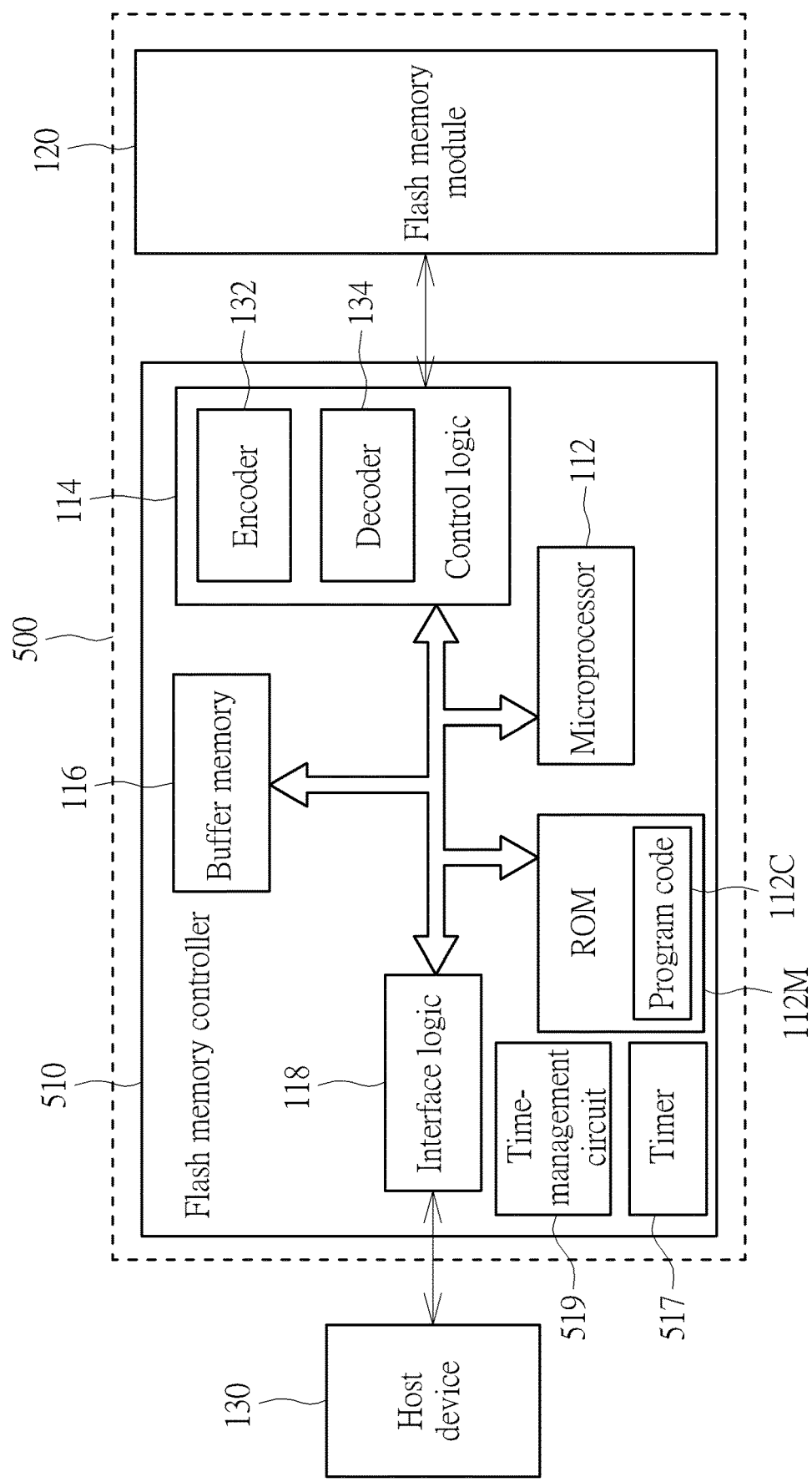
FIG. 5 is a diagram illustrating a memory device according to a second embodiment of the present invention.

FIG. 5 is a diagram illustrating a memory device 500 according to a second embodiment of the present invention. The memory device 500 comprises a flash memory module 120 and a flash memory controller 510, and the flash memory controller 510 is arranged to access the flash memory module 120. In this embodiment, the flash memory controller 510 comprises a microprocessor 112, a ROM 112M, a control logic 114, a buffer memory 116, an interface logic 118, a timer 517 and a time-management circuit 519. The ROM 112M stores a program code 112C, and the control logic 114 comprises an encoder 132 and a decoder 134. Since the elements in FIG. 5 marked with same numbers as those in FIG. 1 may operate similarly, the detailed descriptions thereof are omitted here for brevity. The following illustrations mainly focus on the timer 517 and the time-management circuit 519.

In this embodiment, the time-management circuit 519 may be integrated into the microprocessor 112, and when the flash memory controller 510 is powered on (i.e., the memory device 500 is powered on and the flash memory controller 510 begins to connect to the host device 130), the time-management circuit 519 will receive the initial time (i.e. the time point where the flash memory controller 510 is powered on) from the host device 130. Since the host device 130 has been connected to the operating system, the initial time information (e.g. the month, date, minute, second, etc.) can be provided to the time-management circuit 519. After that, the timer 517 may begin to continuously count the elapse time after the flash memory controller 510 is powered on.

Please further refer to the block 200 shown in FIG. 3, when the flash memory controller 510 needs to write the data from the host device 130, the data in other blocks of the flash memory module 120, and/or the data temporarily stored in the flash memory controller 510 into the block 200, the flash memory controller 510 may sequentially write these data sequentially from the first page P0 to the last page PN. In this embodiment, when the flash memory controller 510 is ready to write data into the last page PN or last few pages, the time-management circuit 519 adds the elapse time after powering on the flash memory controller 510 calculated by the timer 517 onto the initial time, in order to generate time information. After the time-management circuit 119 calculates the time information, it will provide the time information to the microprocessor 512 to be processed by the encoder 132 and be written along with other data into the page PN.

In the embodiment shown in FIG. 5, the time-management circuit 519 obtains the absolute time information (i.e. the aforementioned initial time information) from the host device 130 only when the flash memory controller 510 is powered on. After that, the time-management circuit 519 utilizes the timer 517 thereof to calculate the current absolute time.

Since the last page PN of the block 200 records the absolute time (which is calculated via the contents of the timer 517), when the flash memory controller 510 and the flash memory module 120 are later in the idle state, the flash memory controller 510 may scan each block and directly read the last page PN of each block in order to obtain the elapse time after the block finishes writing. After that, the time-management circuit 519 calculates the current time by adding the elapse time provided by the timer 517 onto the initial time in order to determine how long data has been stored in each block (i.e., the time elapsing from each block finishing wiring to the current block scan operation). In this embodiment, if the time the data being stored in a block exceeds a threshold (e.g., a month or few weeks have passed after the block finishes writing), the flash memory controller 510 may determine the block as encountering data retention problems, and therefore arranges the block to a garbage collection process and moves the valid data in the block to another block at a suitable time point, and then erases the block.

As can be seen from the above, with the management method in this embodiment, the flash memory controller 510 may easily and effectively know how long the data has been stored in each block, for determining whether each block is going to encounter data retention problems and properly dealing with the situation.

As shown in the embodiment of FIG. 5, the microprocessor 112 may also create the time information comparison table 400 shown in FIG. 4, or integrate the contents in the time information comparison table 400 into other comparison tables/mapping tables, e.g. the logical address to physical address mapping table or the physical address to logical address mapping table.

Figure 6:
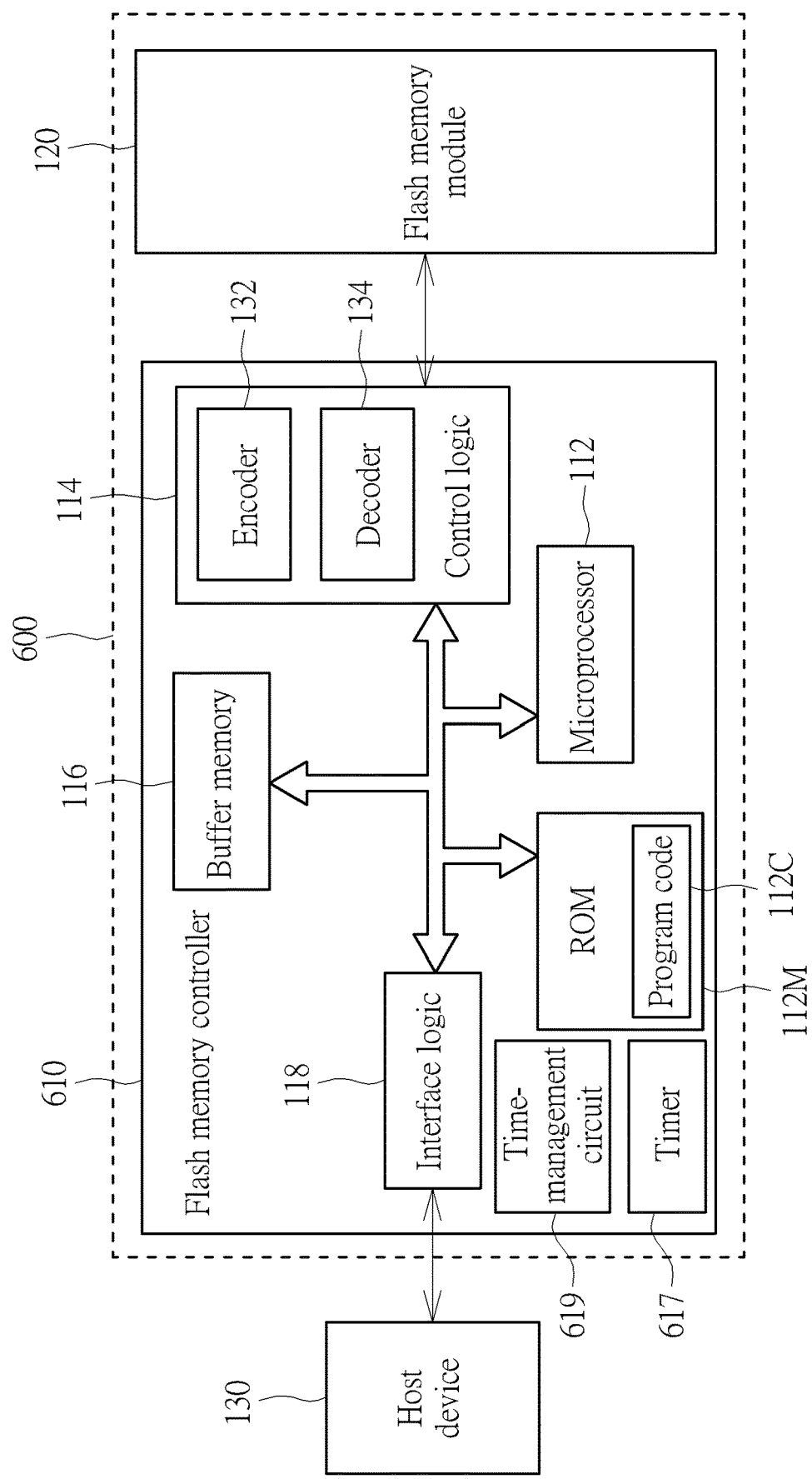
FIG. 6 is a diagram illustrating a memory device according to a third embodiment of the present invention.

FIG. 6 is a diagram illustrating a memory device 600 according to a third embodiment of the present invention. The memory device 600 comprises a flash memory module 120 and a flash memory controller 610, and flash memory controller 610 is arranged to access the flash memory module 120. In this embodiment, the flash memory controller 610 comprises a microprocessor 112, a ROM 112M, a control logic 114, a buffer memory 116, an interface logic 118, a timer 617 and a time-management circuit 619. The ROM 112M stores a program code 112C, and the control logic 114 comprises an encoder 132 and a decoder 134. Note that the elements in FIG. 6 marked with same numbers as those in FIG. 1 may also operate similarly, and therefore the detailed descriptions thereof are omitted here for brevity. The following illustrations mainly focus on the timer 617 and the time-management circuit 619

In this embodiment, the time-management circuit 619 may be integrated into the microprocessor 112, and when the flash memory controller 610 is powered on (i.e., the memory device 600 is powered on and the flash memory controller 610 begins to connect to the host device 130), the time-management circuit 619 obtains a base time at a suitable time point, and the timer 617 begins to continuously calculate the elapse time after the flash memory controller 610 is powered on.

Figure 7:
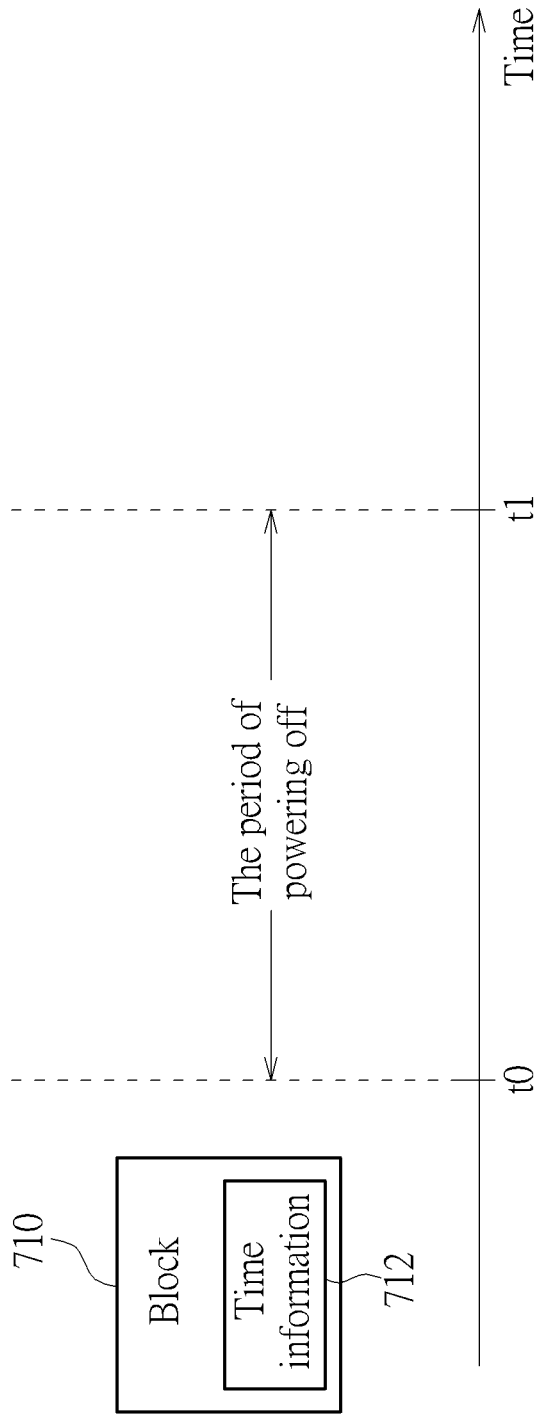
FIG. 7 is a timing diagram illustrating powering on and off of a flash memory controller.

In this embodiment, the time-management circuit 619 will not obtain any absolute time information from the host device 130, but will estimate the current time according to the contents stored in the flash memory module 120 instead. For example, referring FIG. 7, assuming the flash memory controller 610 is powered off at the time point t0 and powered on at the time point t1, the microprocessor 112 may read the time information 712 stored in the block 710 that is the last written block before the time point t0, and may further estimate a predict time for representing the length of powering off (i.e., (t1−t0)). Finally, the time information 712 is added onto the predict time to obtain the base time. In an embodiment, since the flash memory controller 610 cannot precisely know the length of powering off period (i.e., (t1−t0)), the flash memory controller 610 may read the data contents in the block 710 and estimate the predict time according to the data quality of the block 710, in which the poorer the data quality is, the longer it takes to store data (i.e. the length of powering off period will be elongated). For example, the microprocessor 112 may read the data in block 710 and generate the predict time according to the bit error rate of the data, wherein the higher bit error rate suggests that the predict time is longer. For example, the microprocessor 112 may also read the data in the block 710 and determine the voltage distribution of the memory units in the block 710 to generate the predict time, wherein a more scattering voltage distribution suggest that the predict time will be longer. In another example, the microprocessor 112 may also read the data in the block 710 and determine the threshold voltage shifting level of the memory units in the block 710 to generate the predict time, wherein the larger threshold voltage shifting level suggests that the predict time is longer.

Please further refer to the block 200 shown in FIG. 3, when the flash memory controller 610 needs to write the data coming from the host device 130, the data in other blocks of the flash memory module 120, and/or the data temporarily stored in the flash memory controller 610 into the block 200, the flash memory controller 610 may sequentially write these data sequentially into the first page P0 to the last page PN. In this embodiment, when the flash memory controller 610 is going to write data into the last page PN or last few pages, the time-management circuit 619 adds the elapse time after powering on the flash memory controller 610 calculated by the timer 617 onto the initial time in order to generate time information. After the time-management circuit 119 calculates the time information, it will provide the time information to the microprocessor 612 to be processed by the encoder 132 and be written along with other data into the page PN.

When the flash memory controller 610 and the flash memory module 120 are later in the idle state, the flash memory controller 610 may scan each block and directly read the last page PN of each block to obtain the elapse time after the block finishes writing. After that, the time-management circuit 619 calculates the current time by adding the elapse time provided by the timer 617 onto the initial time in order to determine how long data has been stored in each block (i.e., the elapse time from the time each block finishes writing to the time the current block scan operation takes place). In this embodiment, if the time the data being stored in a block exceeds a threshold (e.g., a month or few weeks have passed after the block finishes writing), the flash memory controller 610 may determine the block as encountering data retention problems and therefore arranges the block to a garbage collection process, which moves the valid data in the block to another block at a suitable time point and then erases the block.

As can be seen from the above, with the management method in this embodiment, the flash memory controller 610 may easily and effectively know how long the data has been stored in each block, for determining whether each block is going to encounter data retention problems and properly dealing with the situation.

Figure 8:
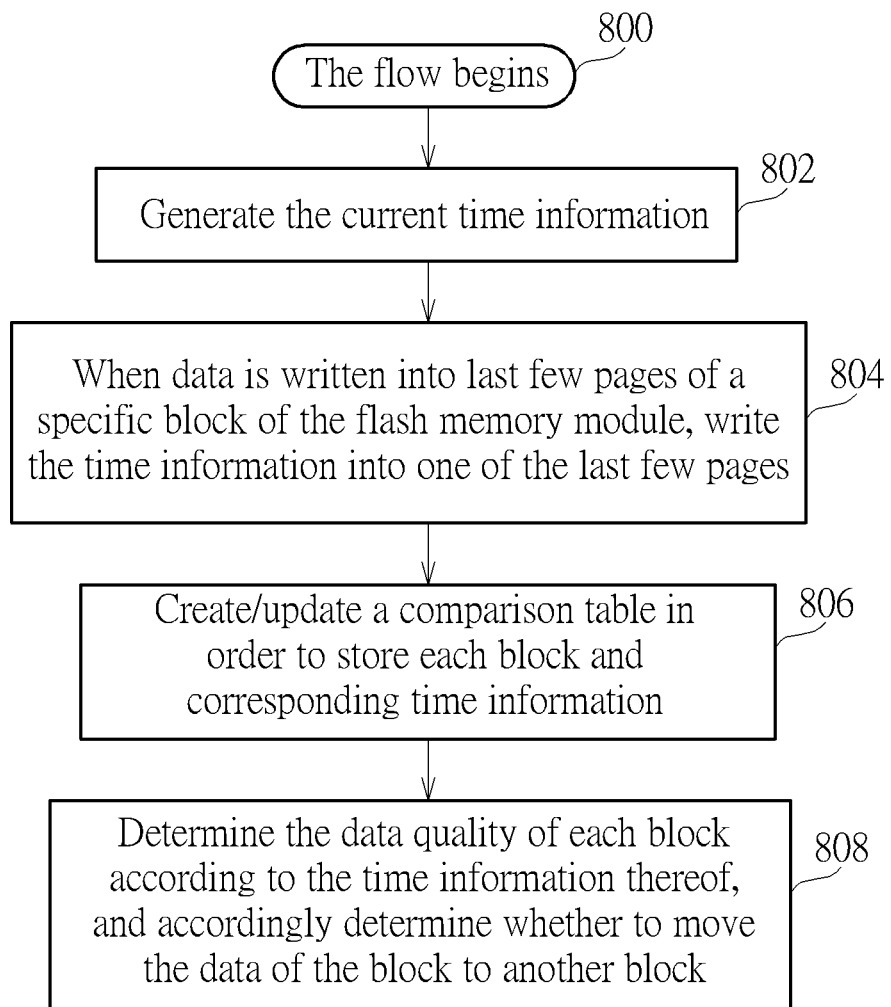
FIG. 8 is a flowchart illustrating a method of managing a flash memory module according to an embodiment of the present invention.

FIG. 8 is a flowchart illustrating a method of managing a flash memory module according to an embodiment of the present invention. The steps in FIG. 8 can be concluded from the aforementioned embodiments and is summarized as follows.

Step 800: The flow begins.
Step 802: Generate current time information.
Step 804: When data is written into last few pages of a specific block of the flash memory module, write the time information into one of the last few pages.
Step 806: Create/update a comparison table/mapping table in order to store each block and corresponding time information.
Step 808: Determine the data quality of each block according to the time information thereof, and accordingly determine whether to move the data of the block to another block.

To summarize, the flash memory controller of the present invention may record the time information of each block and may later fast and effectively determine whether the data retention time is too long which might cause data quality problems, and may perform proper operations in advance to prevent the risk of data loss.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory controller, wherein the flash memory controller is arranged to access a flash memory module, the flash memory module comprises multiple flash memory chips each comprising multiple blocks, each of the blocks comprises multiple pages, and the flash memory controller comprises:
   a read only memory (ROM), arranged to store a program code; and
   a microprocessor, arranged to execute the program code to control the access of the flash memory module, wherein when executing the program code, the microprocessor is arranged to perform operations of:
      monitoring data retention state of one or more blocks by reading a last page of the one or more blocks to obtain time information regarding the one or more blocks, wherein the time information regarding the one or more blocks is generated by the flash memory controller; and
      arranging a specific block to a garbage collection process if time information obtained from the last page of the specific block exceeds a threshold.

2. The flash memory controller of claim 1, wherein the microprocessor writes the time information along with the data into the last page of the one more blocks.

3. The flash memory controller of claim 1, wherein the microprocessor further creates a time information comparison table that records the time information written in the one or more blocks, and temporarily stores the time information comparison table into a dynamic random access memory (DRAM) or a buffer memory inside the flash memory controller.

4. The flash memory controller of claim 1, wherein after writing operations upon all pages of the one or more blocks are finished, the microprocessor updates a logical address to physical address mapping table, and writes the time information into the logical address to physical address mapping table.

5. The flash memory controller of claim 1, wherein the time-management circuit generates the time information according to a base time generated by the flash memory controller.

6. The flash memory controller of claim 5, wherein the base time is generated when the flash memory controller is powered on, and the flash memory controller further comprises:
   a timer, arranged to calculate the elapse time after the flash memory controller is powered on;
   wherein the time-management circuit adds the elapse time after the flash memory controller is powered on onto the base time to generate the time information.

7. The flash memory controller of claim 5, wherein the microprocessor reads the last written block before the flash memory controller is powered on, and generates the base time according to time information recorded by the block.

8. The flash memory controller of claim 7, wherein the microprocessor adds a predict time onto the time information record in the block to generate the base time.

9. The flash memory controller of claim 8, wherein the microprocessor generates the predict time based on data quality of the block.

10. The flash memory controller of claim 9, wherein the microprocessor reads data of the block data, and generates the predict time according to a bit error rate of the data.

11. The flash memory controller of claim 9, wherein the microprocessor reads data of the block and determines a voltage distribution or a threshold voltage shifting level of memory units in the block, in order to generate the predict time.

12. A method of managing a flash memory module, wherein the flash memory module comprises multiple flash memory chips each comprising multiple blocks, each of the blocks comprises multiple pages, and the method comprises:
   monitoring data retention state of one or more blocks by reading a last page of the one or more blocks to obtain time information regarding the one or more blocks, wherein the time information regarding the one or more blocks is generated by the flash memory controller; and
   arranging a specific block to a garbage collection process if time information obtained from the last page of the specific block exceeds a threshold.

13. The flash memory controller of claim 12, wherein the step of writing the time information generated by the time-management circuit into one of the last few pages comprises:
   writing the time information along with the data into the last page of the one or more blocks.

14. An electronic device, comprises:
   a flash memory module, comprising multiple flash memory chips each comprising multiple blocks, and each of the blocks comprises multiple pages; and
   a flash memory controller, arranged to access the flash memory module;
   wherein the flash memory controller monitors data retention state of one or more blocks by reading a last page of the one or more blocks to obtain time information regarding the one or more blocks, wherein the time information regarding the one or more blocks is generated by the flash memory controller; and the flash memory controller arranges a specific block to a garbage collection process if time information obtained from the last page of the specific block exceeds a threshold.

15. The electronic device of claim 14, wherein the flash memory controller writes the time information along with the data into the last page of the one or more blocks.

* * * * *